United States Patent [19]

Olsson et al.

[11] 4,379,608
[45] Apr. 12, 1983

[54] FLAT CABLE TO PLANAR CIRCUIT CONNECTOR

[75] Inventors: Billy E. Olsson, New Cumberland; Lit-Yan Kam, Camp Hill, both of Pa.

[73] Assignee: AMP Incorporated, Harrisburg, Pa.

[21] Appl. No.: 242,748

[22] Filed: Mar. 11, 1981

[51] Int. Cl.³ ............................................. H01R 23/66
[52] U.S. Cl. ...................... 339/75 MP; 339/176 MF; 339/176 MP
[58] Field of Search ....... 339/75 M, 75 MP, 176 MP, 339/17 F, 176 MF

[56] References Cited

U.S. PATENT DOCUMENTS 3,569,905 3/1971 Kehagioglou ................. 339/75 MP
3,697,929 10/1972 Konewko et al. ............. 339/75 MP
3,989,336 11/1976 Rizzio, Jr. et al. ............... 339/17 F
4,181,386 1/1980 Olsson .......................... 339/176 MF

OTHER PUBLICATIONS

IBM Technical Disclosure Bulletin, vol. 14, No. 9, Feb. 1972, "Twin-Contact Connector".

*Primary Examiner*—John McQuade
*Attorney, Agent, or Firm*—Gerald K. Kita

[57] ABSTRACT

An electrical connector applies a pressure connection of a flat cable to an LCD or other substrate, especially one of fragile construction. A clamping bar is biased by a restricted width housing to apply evenly distributed clamping pressure along a flat cable and LCD which previously has been fully assembled into the clamping bar.

4 Claims, 8 Drawing Figures

FLAT CABLE TO PLANAR CIRCUIT CONNECTOR

FIELD OF THE INVENTION

The present invention relates to an electrical connector for establishing a pressure connection between a flexible, flat cable and conductive pads on a glass plate LCD or other type of substrate, particularly one of fragile construction.

DESCRIPTION OF THE PRIOR ART

Flat cable is readily connected with a nonfragile printed circuit board, PCB, either by directly soldering the flat cable conductors to the circuits on the PCB, or applying electrical terminals to the flat cable conductor and then plugging the terminals into apertures provided in the PCB. U.S. Pat. No. 4,172,626 discloses a pressure type connection of a flat cable to post type terminals plugged into apertures of a PCB. The pressure connection is established by a connector clip comprising a clip bar with a plurality of cantilever springs extending from a side edge of the clip bar. The connector clip is mounted on the PCB with the springs extending toward the post type terminals. A flexible, flat cable is inserted between the springs and the terminals, with the springs pressing the flat cable conductors against the terminals to establish electrical connections therewith.

SUMMARY OF THE INVENTION

The present invention resides in a connector for establishing a pressure electrical connection of flat cable conductors with conductive pads on a glass plate LCD or other type substrate which is itself fragile or has fragile conductive pads. The present invention also is readily adaptable as a low insertion force or zero insertion force, ZIF, type connector for fragile substrates.

The connector includes a clamping bar having a flat side and an opposite side divided into a row of cantilever springs which face the flat side. An opening of generous size is defined between the row of springs and the flat side. The end of a flat flexible cable with its conductors bared is laid against the conductive pads of a glass plate LCD. Together the cable and LCD are carefully inserted into the open clamping bar. The clamping bar is already partially assembled within an opening of a channel shaped housing. The clamping bar, together with the cable and LCD are then deeply inserted into the housing. The restricted width of the housing opening biases the springs resiliently against the cable, causing the cable conductors to press against the conductive pads of the LCD and establish pressure electrical connections therewith. The clamping pressure is applied gradually and in a direction which will not disturb alignment of the cable conductors with the conductive pads. Since the clamping pressure is applied only after the cable and LCD are fully assembled within the clamping bar, damage to the fragile LCD is averted. Further, the clamping pressure is evenly distributed along the substrate to compensate for warpage and other unevenness of construction.

Latching tabs are provided on the clamping bar for latching the bar in fully assembled position in the housing. The subject tabs can be pushed against manually to move the clamping bar in reverse direction outwardly of the housing to facilitate disassembly of the parts. All parts are reuseable. To prevent separation of the clamping bar from the housing, and to position the clamping bar in correct partial assembly with the housing, the clamping bar includes one or more tines which slide along slotted tracks provided in the housing.

OBJECTS

An object of the present invention is to provide an inexpensive, easy to apply connector for electrically connecting conductors of a flexible, flat cable with conductive pads on a glass plate LCD or other circuit substrate, especially of fragile construction.

Another object is to provide a ZIF type connector for a fragile substrate in which pressure electrical connections to the substrate are established by a flexible, flat cable, the conductors of which are pressed against conductive pads on the substrate by a clamping bar biased against the cable by insertion of the bar into a housing of restricted width.

Another object of the present invention is to provide a readily disconnectible connector for applying clamping pressure between a flexible, flat cable and conductive pads of a substrate, wherein the clamping pressure is evenly distributed along the substrate, is applied after assembly of the flat cable and substrate in a clamping bar, and is applied gradually and in a direction which will not disturb alignment of the assembled parts.

Other objects and advantages of the present invention will become apparent in the following detailed description taken in conjunction with the drawings.

DETAILED DESCRIPTION OF THE PREFERRED EMBODIMENT

Figure 1:
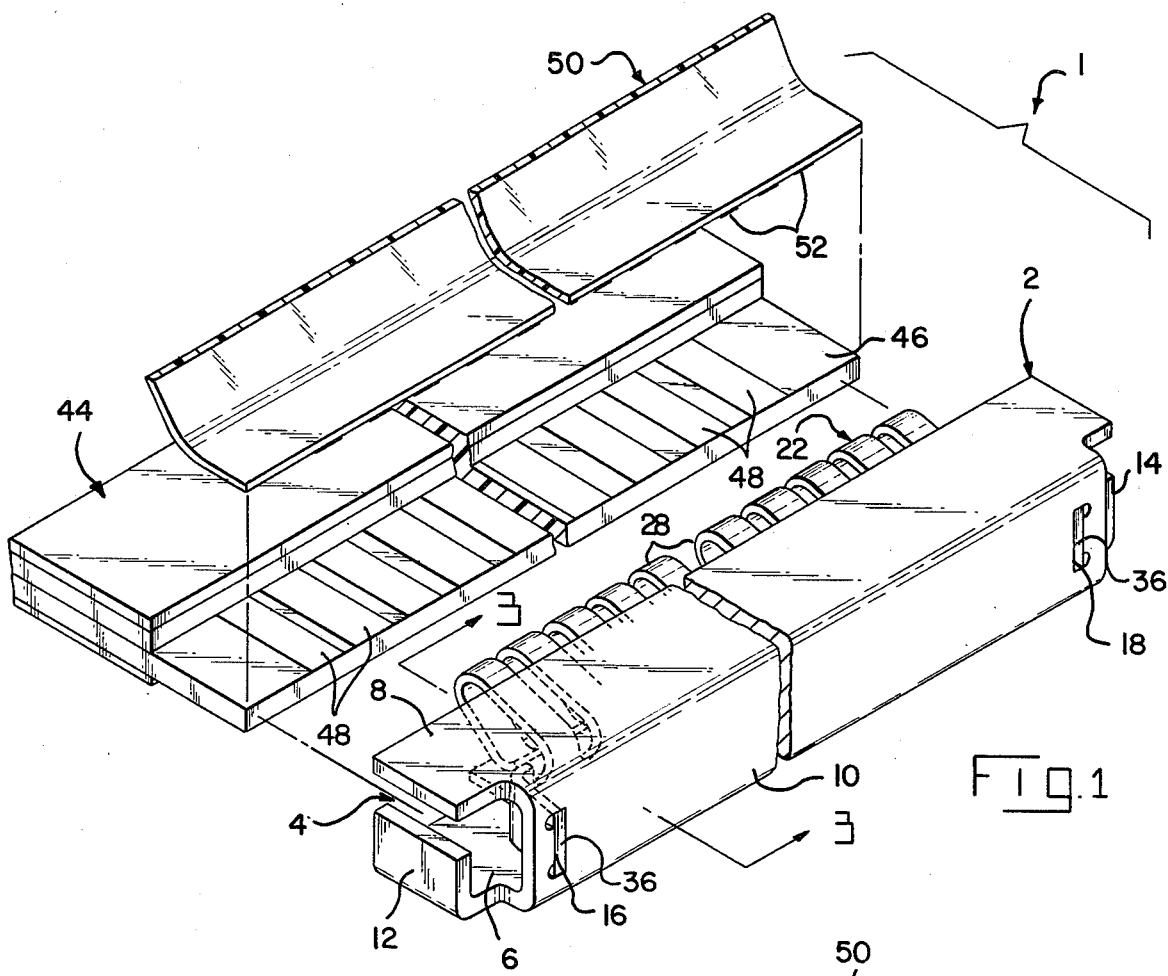
FIG. 1 is a perspective view with parts exploded of a preferred embodiment of a clamping bar, a housing, a glass plate LCD and a flexible, flat cable.
Figure 2:
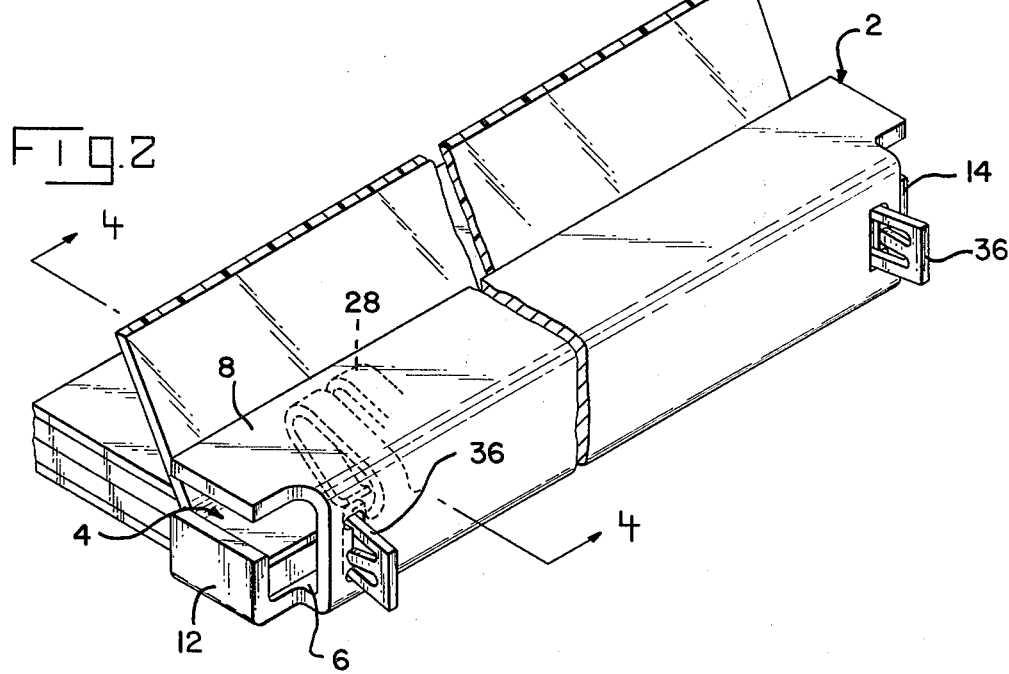
FIG. 2 is a view similar to FIG. 1, with the parts assembled.
Figure 3:
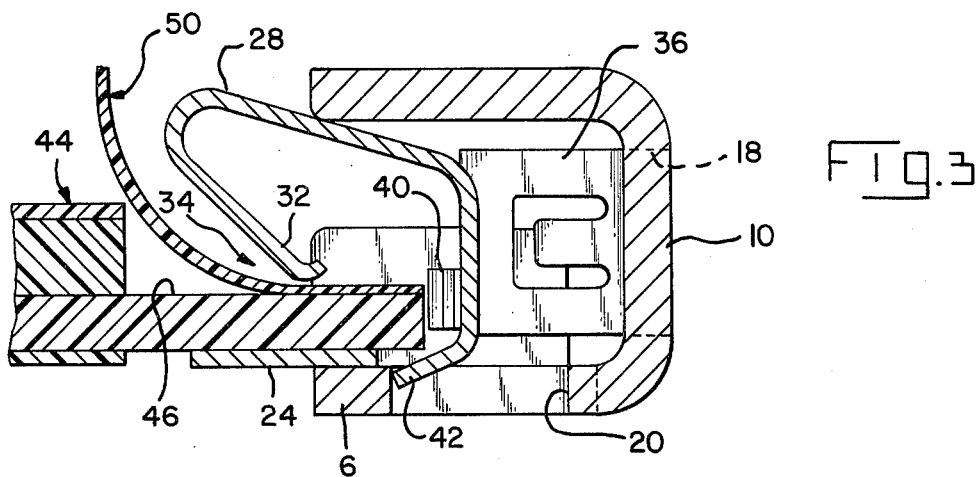
FIG. 3 is a section view taken along the line 3—3 of FIG. 1, with the cable and LCD assembled with the clamping bar.
Figure 4:
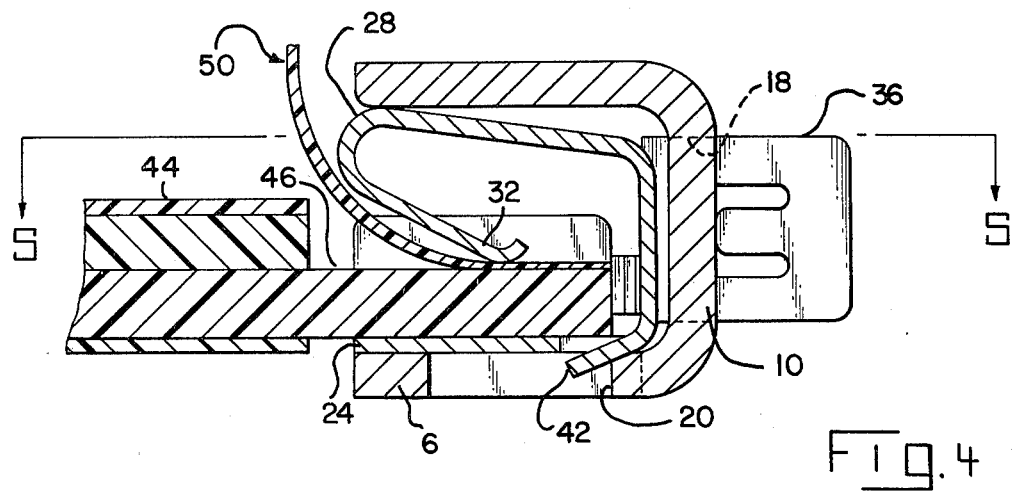
FIG. 4 is a section view taken along the line 4—4 of FIG. 2.
Figure 5:
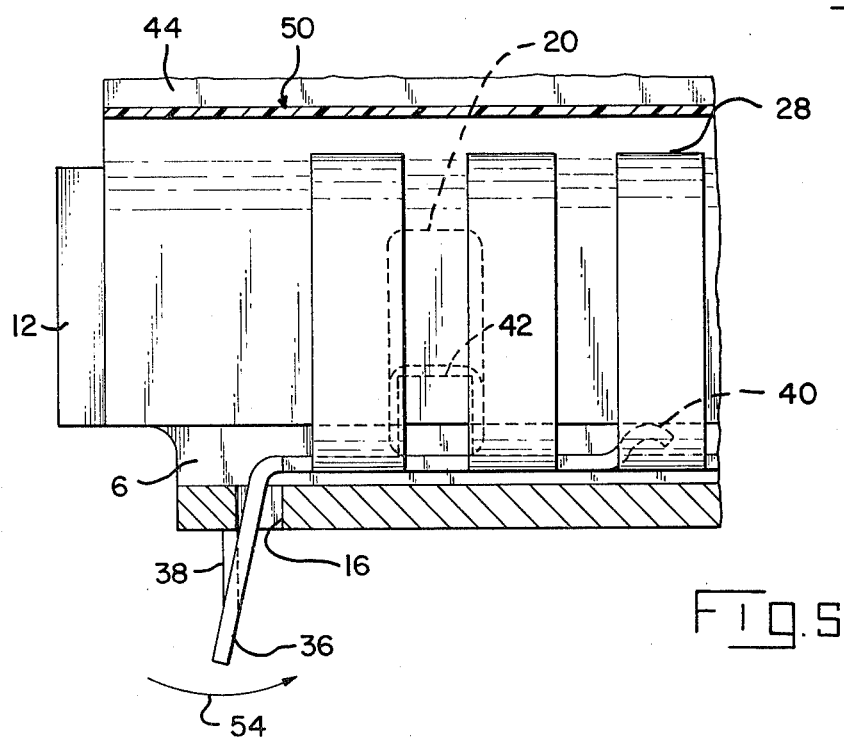
FIG. 5 is a section view taken along the line 5—5 of FIG. 4.

With more particular reference to FIGS. 1-6, a connector generally indicated at 1, includes a channel shaped housing 2, stamped and formed from a single metal plate with an open side 4 defined between parallel, spaced apart side walls 6, 8 and a rear wall 10. The wall 6 is extended with formed up ends 12, 14 defining end walls of the housing 2. As shown in FIGS. 1, 2 and 5, the rear wall 10 is punched to form slots 16, 18 and the wall 6 is punched to form one or more slots, one of which is shown at 20 in FIGS. 3, 4 and 5.

Figure 6:
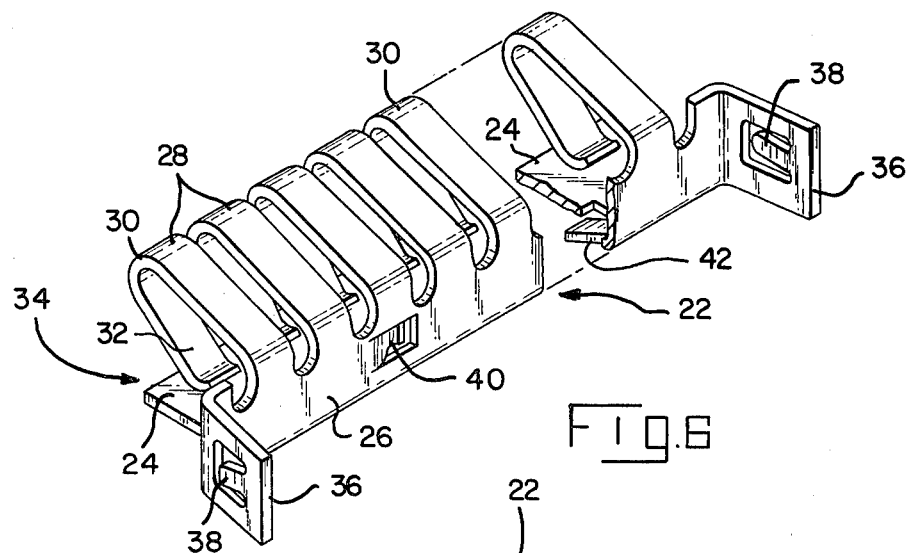
FIG. 6 is a perspective view of a portion of the clamping bar shown in FIG. 1.

FIG. 6 illustrates a clamping bar, generally at 22, stamped and formed from a single sheet of resilient spring metal. The bar 22 is formed with a planar wall 24 merging with a rearward side wall 26, in turn, merging with a row of parallel, elongated, springs 28 extending from the edge of the wall 26. The springs 28 are curved back along themselves as shown at 30. The tips of free ends 32 of the springs are curved back along themselves and define obversely curved, pressure applying portions in spaced relationship from the wall 24. An open side 34 of generous width is defined between the wall 24 and the row of springs 28.

The extended ends of wall 26 are formed to provide resiliently hinged flanges 36 projecting in slightly, diagonally flared, rearward directions. Each flange 36 carries a stubby tab 38 struck to project out of the thickness plane of a respective flange 36.

The wall 26 is formed with one or more stop tabs 40 struck out of the thickness of the wall 26 to project internally of the clamping bar 22. The bottom wall 24 is formed with one or more latch tines 42 struck out of the thickness of the wall 24 to depend outwardly of the clamping bar 22.

As shown in FIGS. 1 and 3, the clamping bar initially is assembled partially into the open side 4 of the housing 2, with the flanges 36 received in respective slots 16 and 18 and flush with the outer surface of rear wall 10. The clamping bar initially projects from the open side 4 of the housing 2 and is wider than the restricted width of the open side. The wall 24 of the clamping bar is mounted against the wall 6 of the housing 2 with each respective tine 42 in registration against a forward end of a respective slot 20. The tine 42 prevents removal of the clamping bar and detents the initial assembly position of the clamping bar.

In FIGS. 1 and 3 a glass plate LCD is shown generally at 44 and includes a planar, glass circuit substrate 46 the surface of which carries circuit pads 48 distributed along an edge of the substrate. Since electrical signals to and from the LCD are transmitted via the pads 48, electrical connections are required for the pads 48. The present invention provides for a direct connection of the pads 48 with conductors 52 of a flexible flat cable 50 which transmits remote electrical signals to and from the LCD. The conductors 52 themselves are flat and are covered by and between a top and a bottom ribbon layers of insulation adhered to one another. The end of the bottom ribbon is peeled and removed, according to well known techniques, baring short lengths of the conductors 52. The bared conductors remain covered by the top layer of cable insulation.

The bared conductors 52 are laid carefully against and in alignment with the pads 48. Then as shown in FIG. 3, the cable and LCD are inserted carefully into the open side 34 of the clamping bar 22. The width of the open side 34 is sufficient to admit freely the cable and LCD without disturbing the alignment thereof. The cable and LCD are fully inserted in the clamping bar when the LCD stops against the tabs 40. Then to complete the pressure electrical connection, the housing 2 is pushed forwardly to insert the clamping bar fully therein. As shown in FIGS. 4 and 5, the restricted width of the housing open side biases the springs 28 resiliently toward the cable, pressing the cable against the LCD, clamping the cable and LCD against the wall 24 and establishing pressure electrical connections between the cable conductors 52 and the pads 48. The clamping pressure is applied gradually during clamping bar insertion, and in directions normal to the cable to avoid disturbance of the cable alignment. No pressure is applied by the clamping bar until the cable and LCD are fully assembled therewith. The respective tabs 42 slidably traverse along respective slots 20 to rearward ends thereof. The flanges 36 slide through the slots 16 and 18 and project outwardly of the rear wall 10. Since the flanges project diagonally they tend to deflect against the sides of the slots 16 and 18, so that, as the projecting tabs 38 emerge they immediately impinge against the outer surface of the rear wall 10, locking the clamping bar in a fully inserted position. To disconnect the connector 1, the flanges 36 are manually pivoted, as shown by the arrow 54 in FIG. 5, to disengage the projecting tabs 38 from the wall 10 and to align the tabs 38 for passage through respective slots 16, 18. Then the flanges 36 are pushed against to slidably traverse the clamping bar 22 in a reverse direction outwardly of the housing 2. The cable and LCD can then be safely removed when the clamping bar is returned to its initial position as shown in FIG. 3.

Figure 7:
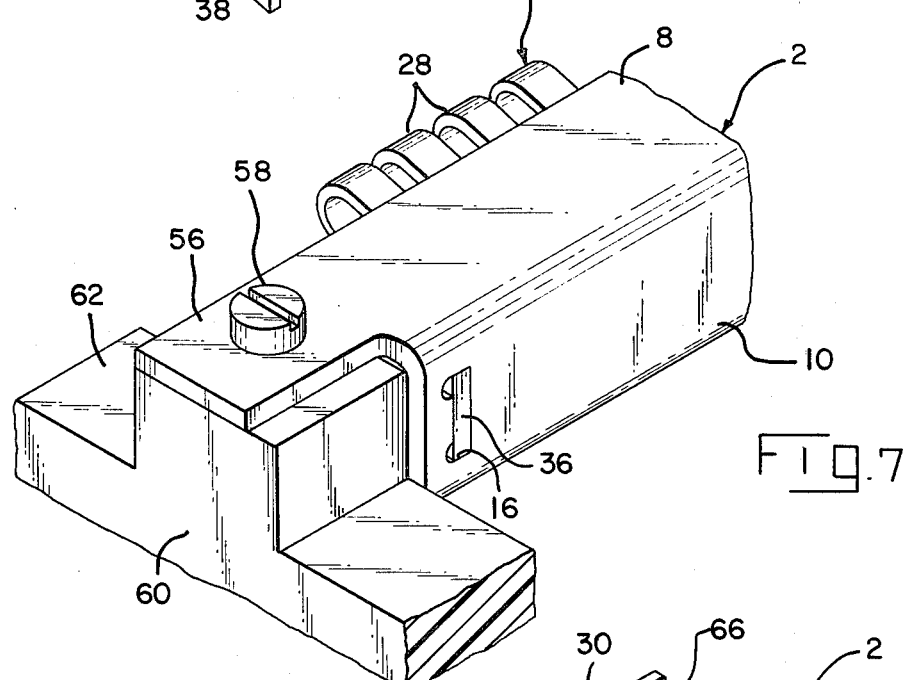
FIG. 7 is a fragmentary perspective view of a second preferred embodiment of the present invention.

Another embodiment of the invention is shown in FIG. 7, wherein each end of the wall 8 of housing 2 is extended laterally beyond walls 10 and 6 to provide integral mounting flanges, one shown at 56, secured by respective screws 58 to the top of a respective mounting block 60 having rails 62 which assist in framing opposite sides of the LCD when the same is inserted into the connector 1. The clamping bar 22 is inserted by displacement thereof into the fixed housing, but only after complete assembly, into the clamping bar, of the cable 50 and LCD in a manner described in conjunction with FIG. 3.

Figure 8:
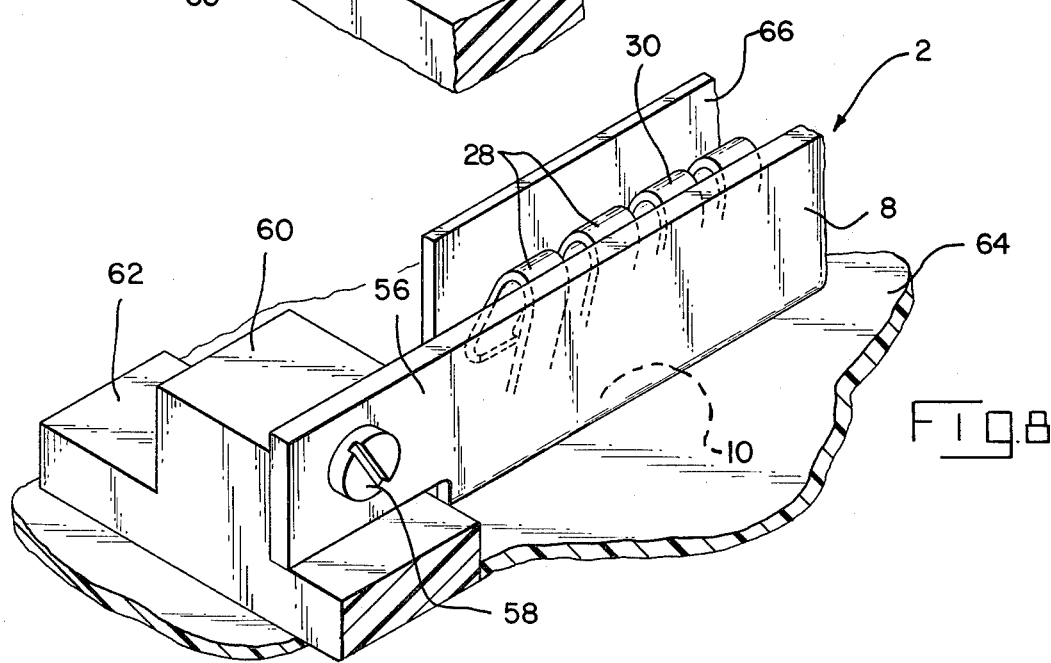
FIG. 8 is a fragmentary perspective view of a third preferred embodiment of the present invention.

Another embodiment of the invention is illustrated in FIG. 8, wherein a housing 2 having the mounting flanges 56 is mounted with its open side projecting outward perpendicular to a surface 64 on which is mounted the blocks 60. This housing orientation provides a connector of the ZIF type for a printed circuit card edge 66. The rails 62 elevate the rear wall 10 to allow projection of the flanges 36 outwardly of rear wall 10 and toward the surface 64. The flanges 56 are secured by the screws 58 to sides of respective blocks 60.

Although preferred embodiments of the present invention are disclosed, other embodiments and modifications which would be apparent to one having ordinary skill is intended to be covered by the spirit and scope of the appended claims.

What is claimed is:

1. A flat cable to substrate connector, comprising:
   a clamping bar having a sidewall and a row of resilient springs spaced from said sidewall to define a width of an open side of said bar,
   a housing having an opening receiving said clamping bar with said open side initially projecting from said opening and having an initial width larger than the width of said opening and larger than the combined thicknesses of a flat cable and a circuit carrying substrate when inserted into said open side,
   said springs being biased by said housing upon relative displacement of said springs into said housing opening to clamp against the combination of said cable and said substrate,
   means for latching said clamping bar to said housing while said springs are biased by said housing,
   said means comprising at least one resilient flange of said clamping bar having a tab projecting through a respective slot in said housing and impinged against an external surface of said housing.

2. The structure as recited in claim 1, wherein, said respective slot has a width to permit passage of a respective said flange and a respective said tab.

3. A flat cable to substrate connector, comprising:

a clamping bar having a sidewall and a row of resilient springs spaced from said sidewall to define a width of an open side of said bar, a housing having an opening receiving said clamping bar with said open side initially projecting from said opening and having an initial width larger than the width of said opening and larger than the combined thicknesses of a flat cable and a circuit carrying substrate when inserted into said open side, said springs being biased by said housing upon relative displacement of said springs into said housing opening to clamp against the combination of said cable and said substrate, means for latching said clamping bar to said housing while said springs are biased by said housing, additional means for detenting said clamping bar in said housing comprising at least one tine of said clamping bar in sliding registration within a respective closed end slot in said housing, said tine impinging against said closed end for detenting said clamping bar in said housing.

4. A flat cable to substrate connector, comprising:

a clamping bar having a sidewall and a row of resilient springs spaced from said sidewall to define a width of an open side of said bar, a housing having an opening receiving said clamping bar with said open side initially projecting from said opening and having an initial width larger than the width of said opening and larger than the combined thicknesses of a flat cable and a circuit carrying substrate when inserted into said open side, said springs being biased by said housing upon relative displacement of said springs into said housing opening to clamp against the combination of said cable and said substrate, additional means for detenting said clamping bar in said housing comprising at least one tine of said clamping bar in sliding resistration within a respective closed end slot in said housing, said tine impinging against said closed end for detenting said clamping bar in said housing.

* * * * *